(12) United States Patent
Paris et al.

(10) Patent No.: US 9,921,252 B2
(45) Date of Patent: Mar. 20, 2018

(54) HIGH VOLTAGE ISOLATION MEASUREMENT SYSTEM

(71) Applicant: Seeo, Inc, Hayward, CA (US)

(72) Inventors: Peter Paris, San Diego, CA (US); Larry Deal, Shelby Township, MI (US); Cathal Oscolai, Solana Beach, CA (US)

(73) Assignee: Seeo, Inc., Hayward, CA (US)

( * ) Notice: Subject to any disclaimer, the term of this patent is extended or adjusted under 35 U.S.C. 154(b) by 398 days.

(21) Appl. No.: 14/660,676

(22) Filed: Mar. 17, 2015

(65) Prior Publication Data

US 2015/0276846 A1 Oct. 1, 2015

Related U.S. Application Data

(60) Provisional application No. 61/972,406, filed on Mar. 30, 2014.

(51) Int. Cl.
*G01R 31/12* (2006.01)
*G01R 27/02* (2006.01)
*G01R 31/36* (2006.01)

(52) U.S. Cl.
CPC ........ *G01R 27/025* (2013.01); *G01R 31/3606* (2013.01)

(58) Field of Classification Search
None
See application file for complete search history.

(56) References Cited

U.S. PATENT DOCUMENTS

| | | | |
|---|---|---|---|
| 6,438,420 B1 | 8/2002 | Thompson | |
| 7,068,040 B2 * | 6/2006 | Stitt | ...... G01R 27/205 324/508 |
| 7,253,584 B2 | 8/2007 | Souther | |
| 7,627,405 B2 | 12/2009 | Tarchinski | |
| 8,188,814 B2 | 5/2012 | Ng | |
| 8,227,763 B2 | 7/2012 | Richards | |
| 2014/0253227 A1 | 9/2014 | Yach | |
| 2015/0061688 A1 | 3/2015 | Loftus | |

OTHER PUBLICATIONS

Standard Test Method, Revised Jun. 23, 2012, 34 pages.*

(Continued)

*Primary Examiner* — Tung Lau
(74) *Attorney, Agent, or Firm* — R'Sue Popowich Caron

(57) ABSTRACT

The isolation resistance value is determined by measuring the voltage across a set of high resistance resistor networks placed between the high voltage battery pack (both the positive and negative terminals) and the chassis ground and then modifying the resistance networks by switching in an additional high resistance network and repeating the measurements. This results in a system that can be assembled using low cost components to determine with a high degree of accuracy the value of the isolation resistance. The implementation of this system does not require expensive solid state relays, as the small amount of resistance through the switching device is negligible when determining the isolation resistance of the high voltage system. The system is not dependent on high precision devices to give accurate isolation resistance detection in a range that is appropriate for high voltage applications.

7 Claims, 2 Drawing Sheets

(56) References Cited

OTHER PUBLICATIONS

Dr. Maciej A. Noras, Non-contact surface charge/voltage measurements Fieldmeter and voltmeter methods, 2002, 6 pages.*
Voltage Detection and Indication by Electric Field Measurement, 2011, 7 pages.*
Wynne, "Isolation in High-Voltage Battery Monitoring for Transportation Applications," Analog Dialogue 43-10, Oct. 2009.
Potdevin, "Insulation Monitoring in High Voltage Systems for Hybrid and Electric Vehicles," ATZelektronik, vol. 4, Jun. 2009, p. 28.
Zhu, "A Novel Soft-Commutating Isolated Boost Full-Bridge ZVS-PWM DC-DC Converter for Bidirectional High Power Applications," IEEE Transactions on Power Electronics, vol. 21, No. 2, Mar. 2006.

* cited by examiner

HIGH VOLTAGE ISOLATION MEASUREMENT SYSTEM

CROSS-REFERENCE TO RELATED APPLICATIONS

This application claims priority to U.S. Provisional Patent Application 61/972,406 filed Mar. 30, 2014, which is incorporated by reference herein.

BACKGROUND OF THE INVENTION

Field of the Invention

This invention relates generally to battery control systems, and, more specifically, to methods of measuring isolation between a battery pack and the chassis of the platform.

Isolation is a means of physically and electrically separating two parts of an electrical system, thus eliminating ground paths between them. By providing electrical isolation, ground loops can be broken, the common mode range for any associated data acquisition system can be increased, and the signal ground reference can be level shifted to a single system ground.

An electrical isolation test is a direct current (DC) resistance test that is performed between subcircuit common and subsystem chassis to verify that a specified level of isolation resistance is met. The test often reveals problems that may have occurred during assembly, such as the presence of defective or incorrect components, improper component placement or orientation, and wire insulation or insulator defects. Any of these can cause inadvertent shorting or grounding to chassis, thus compromising electrical circuit quality and product safety.

Isolation resistance measurements may be achieved using a high input impedance ohmmeter, digital multimeter (DMM) or current-limited (Hipot) test instrument. The selected equipment should not overstress sensitive electronic components in the subsystem. The test limits should also consider semiconductor components within the subsystem that may be activated by the potentials imposed by each type of test instrumentation. A minimum acceptable resistance value is usually specified (typically in the megaohm (MΩ) range per circuit tested). Multiple circuits having a common return may be tested simultaneously, provided the minimum allowable resistance value is based on the number of circuits in parallel.

For a high voltage system such as a battery pack, it is important to be able to measure the isolation between the pack and the chassis of the platform on which it sits. It is also important to measure isolation between any other components that are connected to the high voltage system, such as motor controllers, motors, DC/DC converters and the chassis of the platform. For example, in a vehicle application, it is important to measure the resistance between a high voltage battery and the vehicle chassis. It is also important that the measurement apparatus not induce a fault level resistance between the high voltage system and chassis while it is making the measurement.

Typically, in order to ensure high accuracy and non-interference with other system hardware, isolation measurements are made with costly, high-precision devices. What is needed is an inexpensive way to make such isolation measurements while maintaining non-interference and without sacrificing accuracy.

BRIEF DESCRIPTION OF THE DRAWING

The foregoing aspects and others will be readily appreciated by the skilled artisan from the following description of illustrative embodiments when read in conjunction with the accompanying drawing.

SUMMARY

Figure 1:
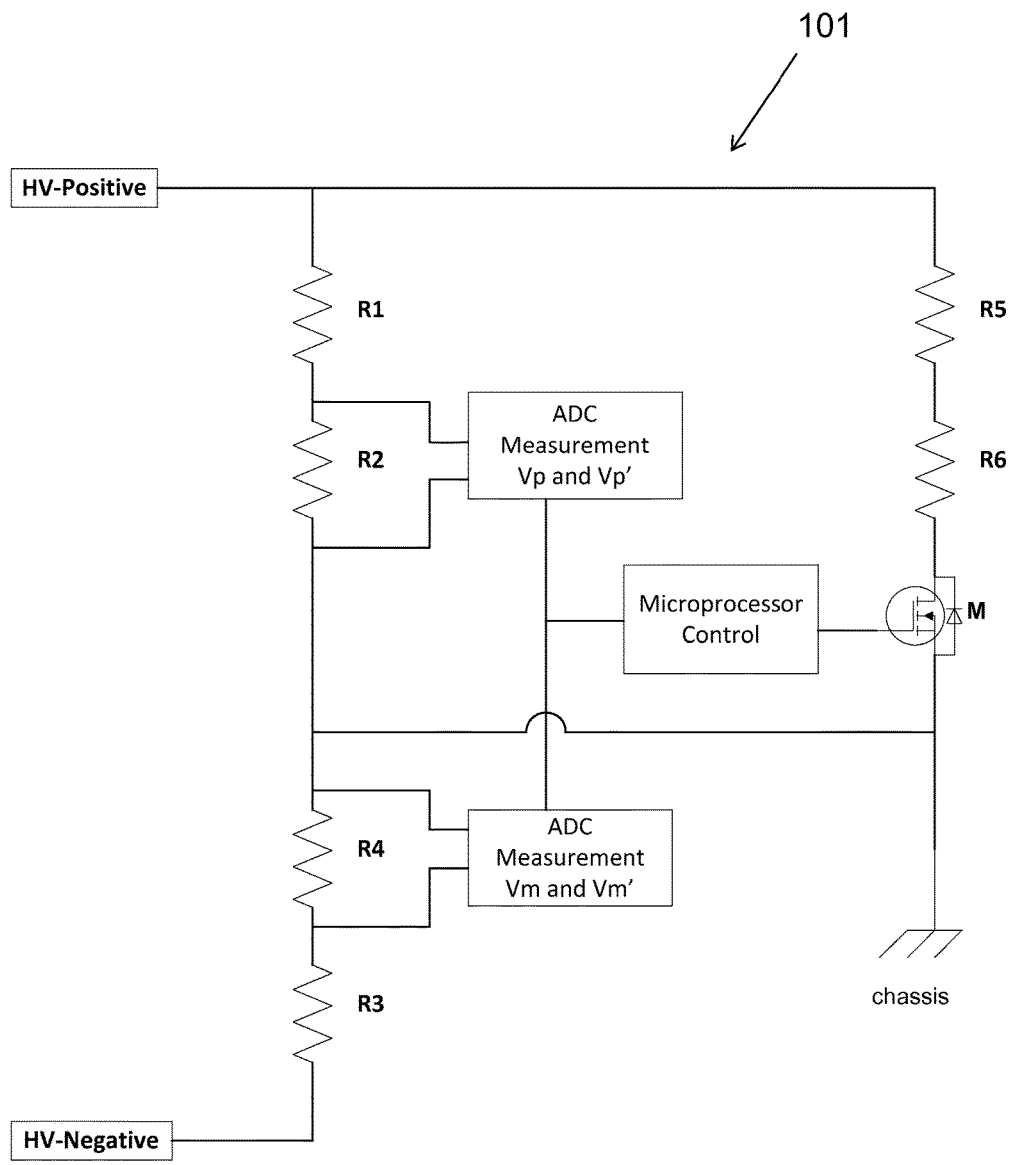
FIG. 1 is a simplified diagram of the hardware necessary to perform an isolation resistance measurement, according to an embodiment of the invention.

A method of determining isolation resistance for a first battery pack is disclosed. The method involves:

providing a first set of high resistance resistor networks, $R_{net}=R_1+R_2=R_3+R_4$, between positive and negative terminals of the pack and chassis ground, wherein $R_2=R_4$;

measuring a high voltage plus, $V_p$, referenced to the chassis ground;

measuring a high voltage minus, $V_m$, referenced to the chassis ground;

switching in a second set of high resistance resistor networks, $R_5+R_6=R_{net}$, between the positive terminal of the pack and the chassis ground by closing a switch;

measuring a high voltage plus, $V_p'$, referenced to the chassis ground with the switch closed;

measuring a high voltage minus, $V_m'$, referenced to the chassis ground with the switch closed;

calculating the following values using the high voltages measured above and $R_{net}$:

$R_m$—Resistance from high voltage minus to the chassis ground $$R_m=R_{net}(V_p'V_m-V_pV_m')/(V_pV_m'-V_pV_p'-V_mV_p')$$

$R_p$—Resistance from high voltage plus to the chassis ground $$R_p=R_{net}R_mV_p/(V_mR_{net}-R_m(V_p-V_m))$$

choosing the smallest of the two calculated values, $R_m$, $R_p$, and naming the smallest value as the isolation resistance of the first battery pack.

In one arrangement, the switch is a MOSFET. In some arrangements, the method is performed in real time on one or more operating battery packs. This can be done concurrently or sequentially on the packs.

The method can be performed through the use of a computer processor and a memory. High voltage measurements and resistance values can be stored in the memory. A computer processor can retrieve the values from the memory and perform the calculations. The computer processor can also determine which of the calculated values, $R_m$, $R_p$, is the smallest and can then identify the smallest as the isolation resistance of the battery pack.

In another embodiment of the invention, a computer-readable medium comprising code is disclosed. Upon execution by a computer processor, the computer-readable medium implements a method of determining the isolation resistance of a battery pack, as follows:

providing a first set of high resistance resistor networks, Rnet=R1+R2=R3+R4, between positive and negative terminals of the pack and chassis ground, wherein R2=R4;

measuring a high voltage plus, Vp, referenced to the chassis ground;

measuring a high voltage minus, Vm, referenced to the chassis ground;

closing a switch to engage a second set of high resistance resistor networks, R5+R6=Rnet, between the positive terminal of the pack and the chassis ground;

measuring a high voltage plus, Vp', referenced to the chassis ground with the switch closed;

measuring a high voltage minus, Vm', referenced to the chassis ground with the switch closed;

recording high voltage data (the values of Vp, Vp', Vm, Vm', as measured in steps b, c, e, f) in a memory location;

retrieving the high voltage data from the memory location and calculating the following values:

Rm—Resistance from high voltage minus to the chassis ground $$Rm=Rnet(Vp'Vm-VpVm')/(VpVm'-VpVp'-VmVp')$$

Rp—Resistance from high voltage plus to chassis ground $$Rp=RnetRmVp/(VmRnet-Rm(Vp-Vm))$$

determining which is the smallest of the two calculated values, Rm, Rp, and naming that smallest value as the isolation resistance of the first battery pack.

In one arrangement, the switch is a MOSFET. In one arrangement, the method is performed in real time on an operating battery.

DETAILED DESCRIPTION

The preferred embodiments are illustrated in the context of high voltage battery packs in vehicles. The skilled artisan will readily appreciate, however, that the materials and methods disclosed herein will have application in a number of other contexts where isolation measurement is desirable, particularly where cost is important.

In one embodiment of the invention, an isolation resistance value is determined by measuring the voltage across a set of high resistance resistor networks placed between a high voltage battery pack (both the positive and negative terminals) and the chassis ground. The resistance networks are then modified by switching in an additional high resistance network and repeating the measurements. Such a system can be assembled using low cost components and can determine the value of the isolation resistance with a very high degree of accuracy.

FIG. 1 is a simplified diagram of an isolation measurement module 101 that has hardware adapted to perform an isolation resistance measurement, according to an embodiment of the invention. The electrical circuit forms a resistor divider, allowing the measurement of high voltage signals. The module can be built on a standard printed circuit board using commercially available components With reference to FIG. 1, in one example, R2, R4 and R6 are each 4 kΩ precision resistors and R1, R3 and R5 are each 2 MΩ precision resistors. High resistor values are often chosen to reduce the leakage to chassis that is inherent with measuring this type of signal.

The isolation measurement module 101 performs a measurement of the isolation resistance for the high voltage energy system (i.e., between the HV-positive and chassis ground). A fixed resistance is placed between high voltage positive and chassis ground and high voltage negative and chassis ground. Thus two measurements can be made: $V_p$—high voltage plus (positive) referenced to chassis ground and $V_m$—high voltage minus (negative) referenced to chassis ground. In a system with no shorts between high voltage and chassis, each measurement would be equal to half of the overall high voltage. In the event there is a short between high voltage and chassis (either hard short or soft short), the two measured voltages may not be equal.

It should be noted that if there is a short between chassis and exactly mid-pack (at half the high voltage), the measurements would again be the same and equal to half the high voltage. In order to know if such a situation is present, in addition to the fixed resistance measurements, an additional resistor network is included by closing a switch, such as a MOSFET, to enable detection of shorts mid pack. In one arrangement, the additional resistor network is placed between the high voltage positive and the chassis ground, though similar results would be expected if it were placed between high voltage negative and chassis ground. Closing the switch and thus engaging the additional resistor network allows two additional measurements to be made: $V_p'$—high voltage plus (positive) referenced to chassis ground switch closed; and $V_m'$—high voltage minus (negative) referenced to chassis ground with switch closed.

The module then uses the four measurements to calculate the minimum isolation resistance measured between the high voltage system and chassis.

The system does not require expensive solid state relays, as the small amount of resistance through the switching device is negligible when determining the isolation resistance of the high voltage system. In addition, by using high resistance networks, such a system is well above the safe levels of leakage allowed (FMVSS 305 stipulates 500 ohms/Volt).

The isolation measurement module is scalable to varying high voltage system voltages. In one embodiment of the invention, target system resistance is about 2000 ohms/Volt for making measurements between high voltage and chassis ground. It should be noted that SAE International recommends 2000 ohms/volt for high voltage applications. In an exemplary circuit, the resistor networks between high voltage positive and chassis ground (with the switch closed) will be the lowest resistance and are designed to adhere to the 2000 (ohms/volt) level.

As discussed above, to determine the isolation resistance between the high voltage battery system and the chassis ground, four measurements are made.

1. $V_p$'High voltage plus (positive) referenced to chassis ground MOSFET switch open;
2. $V_p'$—High voltage plus (positive) referenced to chassis ground MOSFET switch closed;
3. $V_m$—High voltage minus (negative) referenced to chassis ground MOSFET switch open; and
4. $V_m'$—High voltage minus (negative) referenced to chassis ground MOSFET switch closed.

Once the measurements are made, the following equations can be used to calculate the isolation resistance:

Resistance from high voltage minus to chassis ground, $R_m$:

$$R_m=R_{net}(V_p'V_m-V_pV_m')/(V_pV_m'-V_pV_p'-V_mV_p')$$

Resistance from high voltage plus to chassis ground, $R_p$:

$$R_p=R_{net}R_mV_p/(V_mR_{net}-R_m(V_p-V_m))$$

Resistance value used in the isolation measurement network, $R_{net}$:

$$R_{net}=R_1+R_2=R_3+R_4=R_5+R_6$$

The overall resistance is then determined by identifying the smaller of $R_m$ and $R_p$ which is then named to be the overall isolation resistance. Note that $R_2=R_4$ and that $R_{net}$ is the resistance of a single leg of the high voltage measurement network.

Additional calculations can be made to determine the resistances to use in order to meet the 2000 ohms/volt recommendation.

$$R_{fx}=R_1+R_2;$$

wherein $R_{fx}$ is the total resistance in the fixed network, i.e., the network with the switch open;

$$R_{sw}=R_5+R_6;$$

wherein $R_{sw}$ is the total resistance in the switched network, i.e., the network with the switch closed; and $$R_{fx}=R_{sw}=R_{net}$$

The equation to determine the equivalent resistance recommended is:

$$R_{eqv}=((R_1+R_2)*(R_5+R_6))/(R_1+R_2+R_5+R_6)$$

Making substitutions for the above equations (combining individual resistors in a single network to create a fixed network ($R_{fx}$) and a switched network ($R_{sw}$) and recognizing that those two networks should be equal results in the following equations.

$$R_{eqv}=(R_n*R_n)/(R_n+R_n) \text{ or}$$

$$R_{eqv}=R_n/2$$

Determining resistance recommended for a system voltage, $V_{sys}$, $$R_{eqv}=V_{sys}*2000=R_n/2$$

$$R_n=4000*V_{sys}$$

In an exemplary embodiment, isolation resistance is determined for a 500 V ($V_{sys}$) battery pack. $R_n=4000*V_{sys}$, so $R_n$ is 2 MΩ. Thus, the sums $R_1+R_2$ and $R_5+R_6$ are each about 2 MΩ. Within this constraint, $R_1$, $R_2$, $R_5$, and $R_6$ are each chosen to maximize the resolution of the analog to digital converter.

Figure 2:
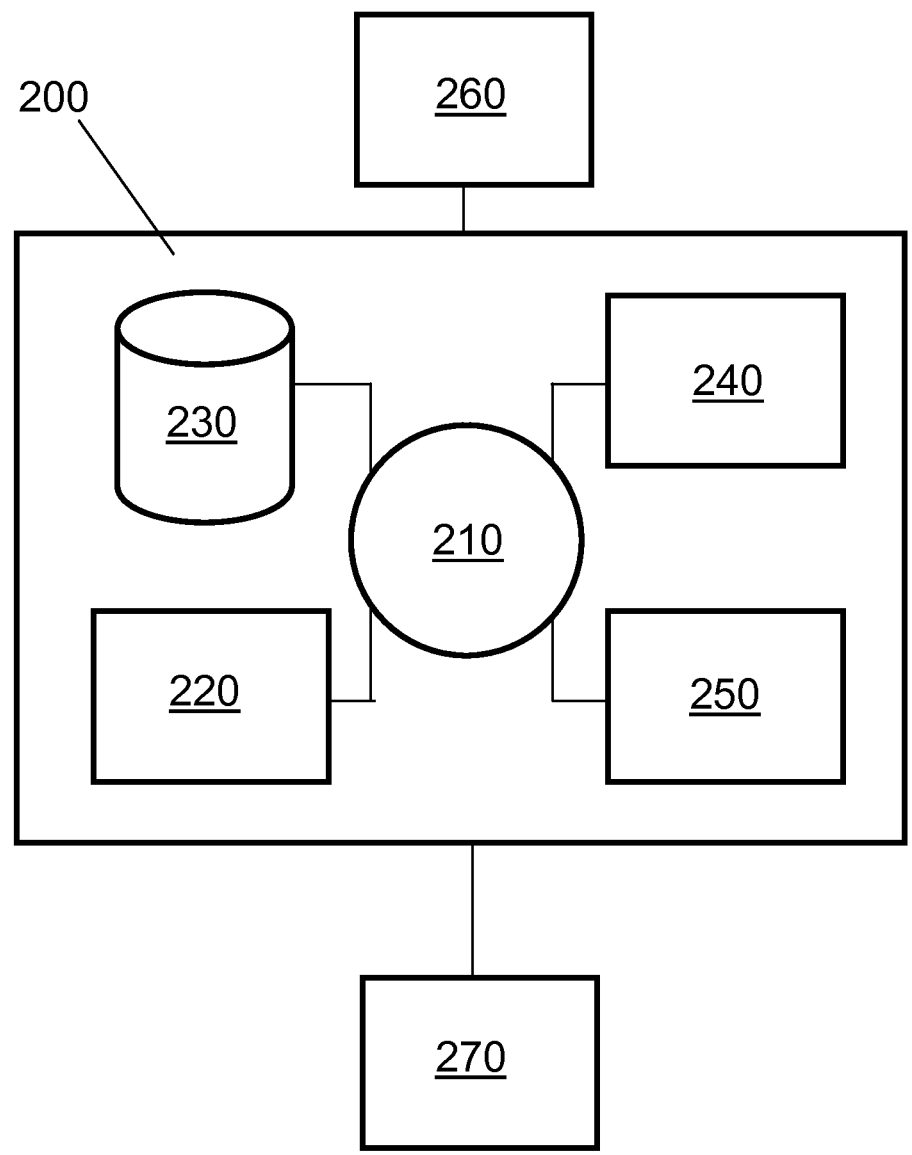
FIG. 2 shows a computer system that is programmed or otherwise configured perform an isolation resistance measurement, according to an embodiment of the invention.

FIG. 2 shows a computer system 200 that is programmed or otherwise configured to determine the minimum isolation resistance between a high voltage battery system and chassis ground.

Methods of the present disclosure, including applications of algorithms for determining minimum isolation resistance, can be implemented with the aid of computer systems. FIG. 2 shows a computer system 200 that is programmed or otherwise configured to determine the minimum isolation resistance. The system 200 includes a central processing unit (CPU, also "processor" and "computer processor" herein) 210, which can be a single core or multi core processor, or a plurality of processors for parallel processing. The system 200 also includes computer memory 220 (e.g., random-access memory, read-only memory, flash memory), electronic data storage unit 230 (e.g., hard disk), communication interface 240 (e.g., network adapter) for communicating with one or more other systems and/or components (e.g., batteries), and peripheral devices 250, such as cache, other memory, data storage and/or electronic display adapters. The memory (or memory location) 220, storage unit 230, interface 240 and peripheral devices 250 are in communication with the CPU 210 through a communication bus (solid lines), such as a motherboard. The storage unit 230 can be a data storage unit (or data repository) for storing data.

In one embodiment of the invention, the isolation measurement module receives a command from a master controller (CPU 210) to begin making voltage measurements. The module makes a series of four measurements (two with the switch open and two with the switch closed as described above). The measurements are stored in the memory location 220. The CPU 210 makes a series of computations (as described above) to determine the isolation resistance between the high voltage battery pack and the chassis ground.

In some situations, the computer system 200 includes a single computer system. In other situations, the computer system 200 includes multiple computer systems in communication with one another, such as by direct connection or through an intranet and/or the Internet.

Methods as described herein can be implemented by way of machine (or computer processor) executable code (or software) stored on an electronic storage location of the system 200, such as, for example, on the memory 220 or electronic storage unit 230. During use, the code can be executed by the processor 210. In some cases, the code can be retrieved from the storage unit 230 and stored on the memory 220 for ready access by the processor 210. As an alternative, the electronic storage unit 230 may be precluded, and machine-executable instructions can be stored in memory 220. The code can be pre-compiled and configured for use with a machine have a processor adapted to execute the code, or can be compiled during runtime. The code can be supplied in a programming language that can be selected to enable the code to execute in a pre-compiled or as-compiled fashion.

The system 200 may include or be coupled to an electronic display 260 for displaying the minimum isolation resistance. The electronic display can be configured to provide a user interface for providing the minimum isolation resistance. An example of a user interface is a graphical user interface. As an alternative, the system 200 can include or be coupled to an indicator for providing the minimum isolation resistance, such as a visual indicator. A visual indicator can include a lighting device or a plurality of lighting devices, such as a light emitting diode, or other visual indicator that displays the minimum isolation resistance or that indicates wither the minimum isolation resistance is within preset limits. Another example of an indicator is an audible indicator or a combination of visual and audible indicators.

The system 200 can be coupled to one or more battery packs 270. The system 200 can execute machine executable code to implement any of the methods provided herein for determining the minimum isolation resistance of the one or more battery packs 270.

Aspects of the methods and systems provided herein, such as methods for determining the minimum isolation resistance, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A method of determining the isolation resistance of a battery pack comprising:
    a. providing a first set of high resistance resistor networks, $R_{net}=R_1+R_2=R_3+R_4$, between positive and negative terminals of the pack and chassis ground, wherein $R_2=R_4$;
    measuring a high voltage plus, $V_p$, referenced to the chassis ground and storing $V_p$ in a memory location;
    measuring a high voltage minus, $V_m$, referenced to the chassis ground and storing $V_m$ in a memory location;
    using a computer processor to send instructions to close a switch to engage a second set of high resistance resistor networks, $R_5+R_6=R_{net}$, between the positive terminal of the pack and the chassis ground;
    measuring a high voltage plus, $V_p'$, referenced to the chassis ground with the switch closed and storing $V_p'$ in a memory location;
    measuring a high voltage minus, $V_m'$, referenced to the chassis ground with the switch closed and storing $V_m'$ in a memory location;
    using a computer processor retrieve high voltage data from the memory location and to calculate the following values:
    $R_m$—Resistance from high voltage minus to chassis ground $$R_m=R_{net}(V_p'V_m-V_pV_m')/(V_pV_m'-V_pV_p'-V_mV_p')$$

$R_p$—Resistance from high voltage plus to chassis ground $$R_p=R_{net}R_mV_p/(V_mR_{net}-R_m(V_p-V_m))$$

using a computer processor to determine which is the smallest of the two calculated values, $R_m$, $R_p$, and naming that smallest value as the isolation resistance of the first battery pack.

2. The method of claim 1 wherein the switch is a MOSFET.

3. The method of claim 1 wherein the method is performed in real time on one or more operating battery packs.

4. The method of claim 3 wherein the method is performed simultaneously on one or more operating battery packs.

5. A non-transitory computer readable medium containing computer instructions stored therein for causing a computer processor to perform a method of determining the isolation resistance of a battery pack, the method comprising:
    a. providing a first set of high resistance resistor networks, $R_{net}=R_1+R_2=R_3+R_4$, between positive and negative terminals of the pack and chassis ground, wherein $R_2=R_4$;
    b. measuring a high voltage plus, $V_p$, referenced to the chassis ground;
    measuring a high voltage minus, $V_m$, referenced to the chassis ground;
    closing a switch to engage a second set of high resistance resistor networks, $R_5+R_6=R_{net}$, between the positive terminal of the pack and the chassis ground;
    measuring a high voltage plus, $V_p'$, referenced to the chassis ground with the switch closed;
    measuring a high voltage minus, $V_m'$, referenced to the chassis ground with the switch closed;
    recording high voltage data (the values of $V_p$, $V_p'$, $V_m$, $V_m'$, as measured in steps b, c, e, f) in a memory location;
    retrieving the high voltage data from the memory location and calculating the following values:
    $R_m$—Resistance from high voltage minus to the chassis ground $$R_m=R_{net}(V_p'V_m-V_pV_m')/(V_pV_m'-V_pV_p'-V_mV_p')$$

$R_p$—Resistance from high voltage plus to chassis ground $$R_p=R_{net}R_mV_p/(V_mR_{net}-R_m(V_p-V_m))$$

determining which is the smallest of the two calculated values, $R_m$, $R_p$, and naming that smallest value as the isolation resistance of the first battery pack.

6. The non-transitory computer-readable medium of claim 5 wherein the switch is a MOSFET.

7. The non-transitory computer-readable medium of claim 5 wherein the method is performed in real time on an operating battery.

\* \* \* \* \*